United States Patent
Khan et al.

(10) Patent No.: US 7,872,335 B2
(45) Date of Patent: Jan. 18, 2011

(54) LEAD FRAME-BGA PACKAGE WITH ENHANCED THERMAL PERFORMANCE AND I/O COUNTS

(75) Inventors: Rezaur Rahman Khan, Rancho Santa Margarita, CA (US); Ken Jian Ming Wang, San Francisco, CA (US)

(73) Assignee: Broadcom Corporation, Irvine, CA (US)

( * ) Notice: Subject to any disclaimer, the term of this patent is extended or adjusted under 35 U.S.C. 154(b) by 472 days.

(21) Appl. No.: 11/987,452

(22) Filed: Nov. 30, 2007

(65) Prior Publication Data

US 2008/0303124 A1  Dec. 11, 2008

Related U.S. Application Data

(60) Provisional application No. 60/929,019, filed on Jun. 8, 2007.

(51) Int. Cl.
*H01L 23/495* (2006.01)
*H01L 23/02* (2006.01)

(52) U.S. Cl. .............. 257/666; 257/686; 257/723; 257/E23.051

(58) Field of Classification Search ............ 257/666, 257/686, 723, E23.051
See application file for complete search history.

(56) References Cited

U.S. PATENT DOCUMENTS

| | | | |
|---|---|---|---|
| 4,480,262 A | 10/1984 | Butt | |
| 4,560,826 A | 12/1985 | Burns et al. | |
| 4,680,613 A | 7/1987 | Daniels et al. | |
| 4,803,544 A | 2/1989 | Holzschuh et al. | |
| 5,105,260 A | 4/1992 | Butera | |
| 5,153,379 A | 10/1992 | Guzuk et al. | |
| 5,294,826 A | 3/1994 | Marcantonio et al. | |
| 5,350,943 A | 9/1994 | Angerstein et al. | |
| 5,376,756 A | 12/1994 | Kwon | |
| 5,386,141 A * | 1/1995 | Liang et al. ............ 257/676 |
| 5,389,816 A | 2/1995 | Shimizu et al. | |
| 5,468,910 A | 11/1995 | Knapp et al. | |

(Continued)

OTHER PUBLICATIONS

John H. Lau "Ball Grid Array Technology", McGraw-Hill, Inc., 1995.

(Continued)

*Primary Examiner*—Nitin Parekh
(74) *Attorney, Agent, or Firm*—Sterne, Kessler, Goldstein & Fox PLLC

(57) ABSTRACT

Methods and apparatus for integrated circuit (IC) packages with improved thermal performance and input/output capabilities are described. An integrated circuit (IC) package includes a leadframe, an IC die, a substrate having opposing first and second surfaces, a first wirebond, and a second wirebond. The leadframe includes a die attach pad having opposing first and second surfaces and a plurality of leads that emanate in an outward direction from the die attach pad. The IC die is coupled to the first surface of the die attach pad. The substrate is coupled to the die attach pad. Contact pads on the first surface of the substrate are electrically connected to bond fingers on the second surface of the substrate. The first wirebond couples a first bond pad on a first surface of the IC die to a bond finger on the second surface of the substrate. The second wirebond couples a second bond pad on the first surface of the IC die to a lead of the plurality of leads.

22 Claims, 10 Drawing Sheets

U.S. PATENT DOCUMENTS

| | | | |
|---|---|---|---|
| 5,486,720 A | 1/1996 | Kierse | |
| 5,497,032 A | 3/1996 | Tsuji et al. | |
| 5,559,306 A | 9/1996 | Mahulikar | |
| 5,596,225 A * | 1/1997 | Mathew et al. | 257/667 |
| 5,608,265 A | 3/1997 | Kitano et al. | |
| 5,642,261 A | 6/1997 | Bond et al. | |
| 5,650,659 A | 7/1997 | Mostafazadeh et al. | |
| 5,668,406 A | 9/1997 | Egawa | |
| 5,889,316 A | 3/1999 | Strobel et al. | |
| 5,977,626 A | 11/1999 | Wang et al. | |
| 5,986,340 A | 11/1999 | Mostafazadeh et al. | |
| 6,011,303 A | 1/2000 | Tanaka et al. | |
| 6,020,624 A * | 2/2000 | Wood et al. | 257/618 |
| 6,092,281 A | 7/2000 | Glenn | |
| 6,229,702 B1 | 5/2001 | Tao et al. | |
| 6,376,914 B2 * | 4/2002 | Kovats et al. | 257/777 |
| 6,395,582 B1 | 5/2002 | Sohn et al. | |
| 6,432,742 B1 | 8/2002 | Guan et al. | |
| 6,501,184 B1 | 12/2002 | Shin et al. | |
| 6,528,876 B2 | 3/2003 | Huang | |
| 6,552,428 B1 | 4/2003 | Huang et al. | |
| 6,614,102 B1 | 9/2003 | Hoffman et al. | |
| 6,617,200 B2 | 9/2003 | Sone | |
| 6,707,140 B1 | 3/2004 | Nguyen et al. | |
| 6,737,750 B1 | 5/2004 | Hoffman et al. | |
| 6,775,140 B2 | 8/2004 | Shim et al. | |
| 6,825,108 B2 | 11/2004 | Khan et al. | |
| 6,838,761 B2 | 1/2005 | Karnezos | |
| 6,853,070 B2 | 2/2005 | Khan et al. | |
| 6,861,288 B2 * | 3/2005 | Shim et al. | 438/109 |
| 6,906,414 B2 | 6/2005 | Zhao et al. | |
| 6,919,630 B2 | 7/2005 | Hsiao | |
| 6,951,982 B2 * | 10/2005 | Chye et al. | 174/350 |
| 6,989,593 B2 | 1/2006 | Khan et al. | |
| 7,005,737 B2 | 2/2006 | Zhao et al. | |
| 7,015,072 B2 | 3/2006 | Combs et al. | |
| 7,026,711 B2 | 4/2006 | Lee et al. | |
| 7,038,312 B2 | 5/2006 | Khan et al. | |
| 7,057,277 B2 | 6/2006 | Chen et al. | |
| 7,061,102 B2 | 6/2006 | Eghan et al. | |
| 7,078,806 B2 | 7/2006 | Khan et al. | |
| 7,102,225 B2 | 9/2006 | Khan et al. | |
| 7,132,744 B2 | 11/2006 | Zhao et al. | |
| 7,148,084 B2 | 12/2006 | Strobel et al. | |
| 7,161,239 B2 | 1/2007 | Zhao et al. | |
| 7,198,987 B1 | 4/2007 | Warren et al. | |
| 7,202,559 B2 | 4/2007 | Zhao et al. | |
| 7,227,256 B2 | 6/2007 | Zhao et al. | |
| 7,259,445 B2 | 8/2007 | Lau et al. | |
| 7,259,448 B2 | 8/2007 | Zhang et al. | |
| 7,259,457 B2 | 8/2007 | Zhang et al. | |
| 2002/0024137 A1 | 2/2002 | Olofsson et al. | |
| 2002/0079572 A1 | 6/2002 | Khan et al. | |
| 2002/0190361 A1 | 12/2002 | Zhao et al. | |
| 2003/0057550 A1 | 3/2003 | Zhao et al. | |
| 2003/0111728 A1 | 6/2003 | Thai et al. | |
| 2003/0146509 A1 | 8/2003 | Zhao et al. | |
| 2003/0178719 A1 | 9/2003 | Combs et al. | |
| 2004/0038447 A1 | 2/2004 | Corisis et al. | |
| 2004/0084771 A1 | 5/2004 | Bolken et al. | |
| 2004/0178499 A1 | 9/2004 | Minstry et al. | |
| 2005/0029657 A1 | 2/2005 | Khan et al. | |
| 2005/0035452 A1 | 2/2005 | Zhang et al. | |
| 2005/0077545 A1 | 4/2005 | Zhao et al. | |
| 2005/0127501 A1 | 6/2005 | Khan et al. | |
| 2005/0280127 A1 | 12/2005 | Zhao et al. | |
| 2005/0280139 A1 | 12/2005 | Zhao et al. | |
| 2005/0280141 A1 | 12/2005 | Zhang | |
| 2006/0012037 A1 | 1/2006 | Raedt et al. | |
| 2006/0166397 A1 | 7/2006 | Lau et al. | |
| 2007/0007644 A1 | 1/2007 | Zhao et al. | |
| 2007/0045824 A1 | 3/2007 | Zhao et al. | |
| 2007/0090502 A1 | 4/2007 | Zhao et al. | |
| 2007/0170570 A1 * | 7/2007 | Camacho et al. | 257/686 |
| 2007/0200210 A1 | 8/2007 | Zhao et al. | |
| 2007/0267734 A1 | 11/2007 | Zhao et al. | |
| 2007/0267740 A1 | 11/2007 | Khan et al. | |
| 2007/0273023 A1 | 11/2007 | Zhao et al. | |
| 2007/0273049 A1 | 11/2007 | Khan et al. | |
| 2007/0278632 A1 | 12/2007 | Zhao et al. | |
| 2007/0290322 A1 | 12/2007 | Zhao et al. | |
| 2007/0290376 A1 | 12/2007 | Zhao et al. | |
| 2008/0054432 A1 * | 3/2008 | Corisis et al. | 257/686 |

OTHER PUBLICATIONS

"ASAT's Fine-Pitch Ball Grid Array", ASAT Peak Performance, retrieved from the internet on Oct. 27, 2006, http://www.asat.com/index.php, pp. 1-2.

"PBGA Plastic Ball Grid Array", ASAT Peak Performance, retrieved from the internet on Oct. 27, 2006, http://www.asat.com/products/array/pbga.php, pp. 1-2.

"Stacked Die", ASAT Peak Performance, retrieved from the internet on Oct. 27, 2006, http://www.asat.com/products/sip/stacked.phP, p. 1.

"TAPPTM Thin Array Plastic Package", ASAT Peak Performance, retrieved from the internet on Oct. 27, 2006, http://www.asat.com/products/leadless/tapp.php, pp. 1-5.

Babinetz, Stephen, "Wire Bonding Solutions for 3-D Stacked Die Packages", Kulicke & Soffa Industries, as published in Electronics Manufacturing Engineering, Q3, 2003, pp. 1-10.

Carson et al. "Advances In Stacked-Die Packaging", ChipPAC Inc., 2002, pp. 7-13.

Freyman et al., "Overmolded Plastic Pad Array Carriers (OMPAC): A low Cost, High Interconnect Density IC Packaging Solution for Consumer and Industrial Electronics", Electronic Components and Technology Conference, IEEE, 1991, pp. 176-182.

Harper, Charles A., "Packaging and Interconnection of Integrated Circuits," Electronic Packaging and Interconnection Handbook, 3rd Edition, pp. 7.61-7.67, McGraw-Hill, U.S.A., copyright 2000.

Dreiza et al., "Implement stacked package-on-package designs", Amkor Technology Inc., retrieved from the internet on Oct. 17, 2005 http://www.eetasia.com/ARTICLES/2005OCT/B/2005OCT17_EDA_MFG_TA.pdf., pp. 1-3.

* cited by examiner

LEAD FRAME-BGA PACKAGE WITH ENHANCED THERMAL PERFORMANCE AND I/O COUNTS

CROSS REFERENCE TO RELATED APPLICATIONS

This application claims the benefit of U.S. Provisional Appl. No. 60/929,019, filed Jun. 8, 2007, which is incorporated by reference herein in its entirety.

BACKGROUND OF THE INVENTION

1. Field of the Invention

The invention relates generally to the field of integrated circuit (IC) device packaging technology and, more particularly to improved thermal performance and input/output capabilities in IC device packages.

2. Background

Integrated circuit semiconductor chips or dies are typically mounted in or on a package that is attached to a printed circuit board (PCB). Leadframes are widely used in IC packages as a carrier for the IC die and as an interconnection mechanism between the die and the electrical circuits of the PCB. Various leadframe packages have been developed and package family outlines have been standardized by the Electronic Industries Alliance (EIA), the Joint Electron Device Engineering Council (JEDEC), and the Electronic Industries Alliance of Japan (EIAJ).

However, the thermal performance and input/output (I/O) capabilities of commercially available leadframe packages are often limited by their mechanical structure. Thus, what is needed is improved thermal performance and increased input/output capabilities in integrated circuit packages.

SUMMARY OF THE INVENTION

Apparatuses, methods, and systems for improved integrated circuit packages are described. An integrated circuit (IC) package includes a leadframe, an IC die, a substrate having opposing first and second surfaces, a first wirebond, and a second wirebond. The leadframe includes a die attach pad having opposing first and second surfaces and a plurality of leads that emanate in an outward direction from the die attach pad. The IC die is coupled to the first surface of the die attach pad. Contact pads on the first surface of the substrate are electrically connected to bond fingers on the second surface of the substrate. The first wirebond couples a first bond pad on a first surface of the IC die to a bond finger on the second surface of the substrate. The second wirebond couples a second bond pad on the first surface of the IC die to a lead of the plurality of leads.

A method of assembling an IC device package includes forming a leadframe having a die attach pad and a plurality of leads, coupling an IC die to the die attach pad, coupling a substrate to the die attach pad, forming a first wirebond that couples a first bond pad on a first surface of the IC die to a bond finger on a first surface of the substrate, and forming a second wirebond that couples a second bond pad on the first surface of the IC die to a lead of the plurality of leads.

These and other advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
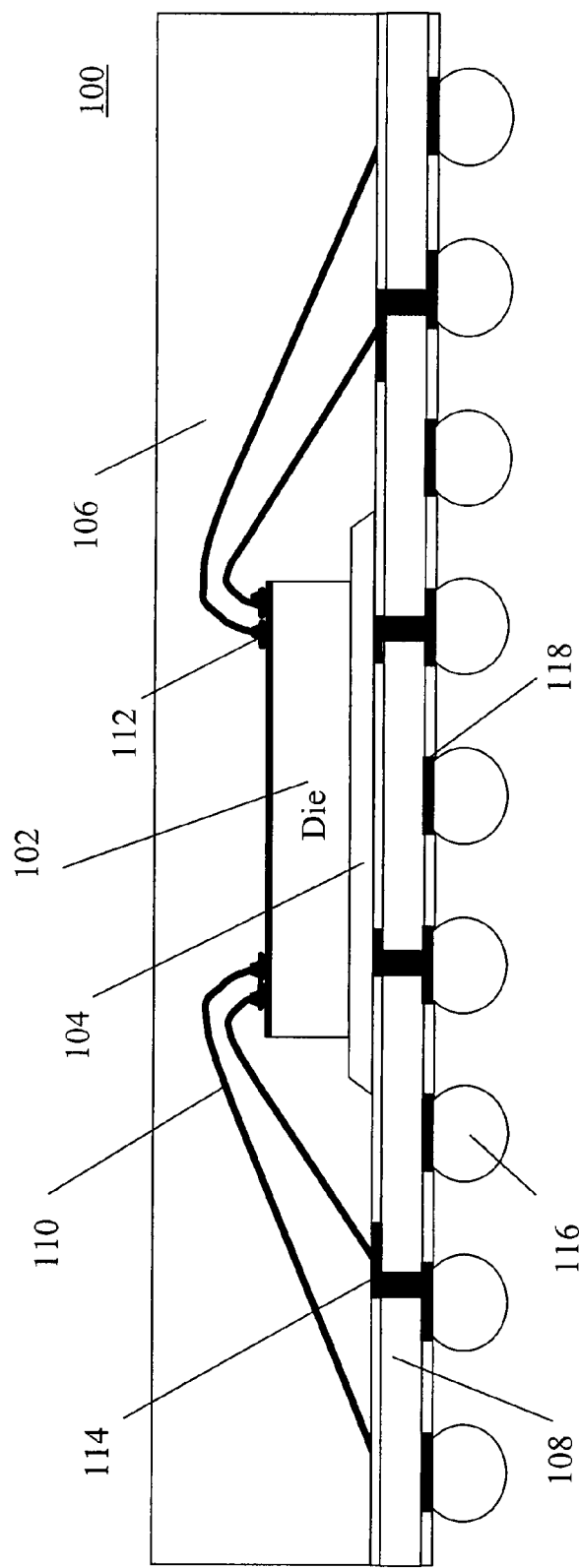
FIG. 1 illustrates an exemplary ball grid array (BGA) package.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Overview

The present invention is directed to methods and apparatuses for integrated circuit (IC) packages with respect to improving thermal performance and/or input/output (I/O) capabilities.

It is noted that references in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Example Integrated Circuit Packages

A ball grid array (BGA) package is used to package and interface an IC die with a circuit board such as a printed circuit board (PCB). BGA packages may be used with any type of IC die, and are particularly useful for high speed ICs. In a BGA package, solder pads do not utilize the surrounding of the package periphery, as in chip carrier type packages, but instead only cover the bottom package surface in an array configuration. BGA packages are also referred to as pad array carrier (PAC), pad array, land grid array, and pad-grid array packages. For additional description on BGA packages, refer to Lau, J. H., Ball Grid Array Technology, McGraw-Hill, New York, (1995), which is herein incorporated by reference in its entirety.

FIG. 1 shows an exemplary ball grid array (BGA) package 100. As shown in FIG. 1, BGA package 100 includes an IC die 102, an adhesive 104, a mold compound 106, a substrate 108, wirebonds 110, bond pads 112, bond fingers 114, solder balls 116, and contact pads 118. In the embodiment of FIG. 1, contact pads 118 are solder ball pads that allow solder balls 116 to be formed thereon. IC die 102 is attached to a first surface of substrate 108 using adhesive 104. Adhesive 104 may be a film, silver epoxy, or other thermally and/or electrically conductive adhesive. Wirebonds 110 couple bond pads 112 on a first surface IC die 102 to bond fingers 114 on the first surface of substrate 108. Wirebonds 110 may be formed out of an electrically conductive material such as gold or other metal. Bond fingers 114 electrically couple wirebonds 110 to contact pads 118 through substrate 108. Solder balls 116 are electrically coupled to contact pads 118 on a second surface of substrate 108. Solder balls 116 may be coupled to electrically conductive portions of a printed circuit board (PCB) to which package 100 is mounted. Mold compound 106 encapsulates IC die 102, wirebonds 110, and the first surface of substrate 108, for environmental protection.

Die-up and die-down BGA package configurations exist. In die-up BGA packages, the IC die is mounted on a top surface of the substrate, in a direction away from the PCB. In die-down BGA packages, the IC die is mounted on a bottom surface of the substrate, in a direction towards the PCB.

A number of BGA package substrate types exist, including ceramic, plastic, and tape (also known as "flex"). For example, substrate 108 may be a resin substrate.

In package 100, heat may be conducted from the first surface of IC die 102 through wirebonds 110, which are coupled to bond fingers 114 and contact pads 118 and finally to the PCB via solder balls 116. However, traces used to form bond fingers 114 are typically small and often do not provide for high thermal conductivity from IC die 102. Wirebonds 110 are also often thin (e.g., diameters on the order of 25 micrometers) and similarly may not offer high thermal conductivity. Through convection, heat may also escape from the first surface of IC die 102 to the outside environment (e.g., air) through mold compound 106. Heat may also be conducted away from a second surface of IC die 102 that is coupled to substrate 108 through adhesive 104. However, substrate 108 is often formed out of a thermally insulative material. Thus BGA package 100 often does not provide for effective conduction of heat generated by IC die 102.

Figure 2:
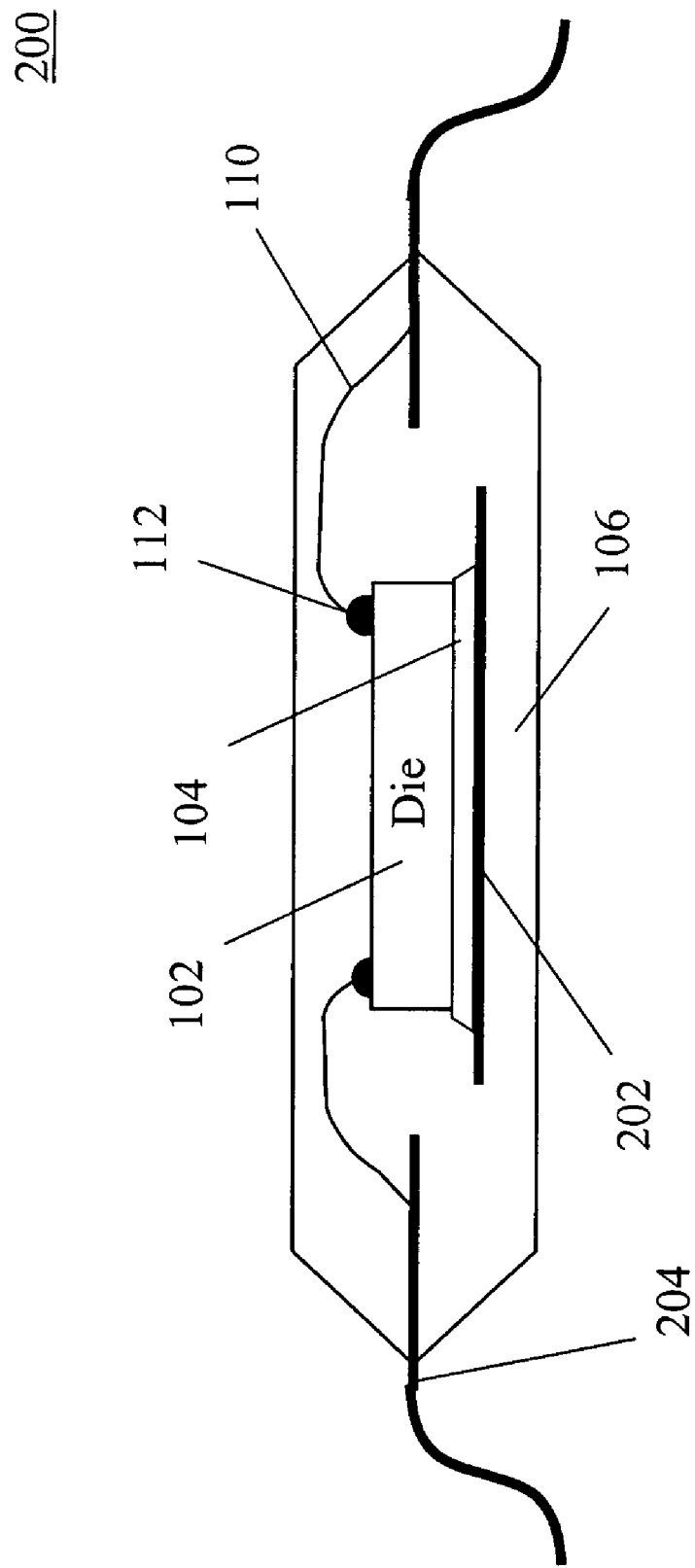
FIG. 2 illustrates an exemplary leadframe package.

FIG. 2 shows a leadframe package 200. Leadframe package 200 includes IC die 102, wirebonds 110, bond pads 112, mold compound 106, a die attach pad 202, and leads 204. Die attach pad 202 and leads 204 form a leadframe. Leads 204 emanate in an outward direction from die attach pad 202. IC die 102 is attached to die attach pad 202 through adhesive 104. Wirebonds 110 couple bond pads 112 to leads 204. Through leads 204, then, IC die 102 may be coupled to areas of a PCB to which package 200 is mounted. Although not shown in FIG. 2, leads 204 may be fused to die attach pad 202 at different locations along die attach pad 202 or may be isolated from die attach pad 202.

Since BGA package 100 allows for connections to a PCB to be formed throughout the entire footprint (i.e., bottom surface) of substrate 108 rather than only along the periphery of the package as in leaderframe package 200, BGA package 100 allows for a relatively high number of connections to the PCB compared to leadframe package 200. As would be apparent to those skilled in the relevant art(s), as the number of possible connections to the PCB increase, the number of possible I/O connections the package may support also increases. The I/O connections may be used to communicate with other IC packages mounted on the PCB. An increased number of I/O connections often results in faster communications between different components mounted on a PCB.

As described above, BGA package 100 has relatively poor thermal performance since IC die 102 is not connected to the PCB through highly thermally conductive connections. In contrast, leadframe package 200 provides for a substantially direct path for heat to be conducted away from IC die 102 via die attach pad 202 and leads 204. Leads 204 are typically highly thermally conductive. Moreover, in leadframe package 200, IC die 102 is coupled to die attach pad 202. Die attach pad 202 is also formed out of a highly thermally conductive material such as copper paste or silver epoxy. Thus, heat may also be conducted away from the second surface of IC die 102 through die attach pad 202 and to the PCB through leads of leads 204 that are fused with die attach pad 202.

As would be appreciated by those skilled in the relevant art(s), traces routed on the top level of the PCB typically result in better signal performance compared to traces routed on other levels of the PCB. Leads 204 of leadframe package 200 are often configured so that traces emanating therefrom are routed on the top level of the PCB. In contrast, the high density connections of a BGA package (e.g., solder balls 116) often require at least some traces to be routed on multiple levels of the PCB. Therefore, signals transmitted from and received by leadframe package 200 tend to have improved signal performance compared to signals resulting from connections formed by BGA package 100. Moreover, since leads 204 have a relatively high electrical conductivity when compared to traces used to route signals through substrate 108 of BGA package 100, leadframe package 200 also often results in increased power and ground stability. Such power and ground stability is often important in embodiments where IC die 102 is a memory component.

Example Embodiments

Figure 3:
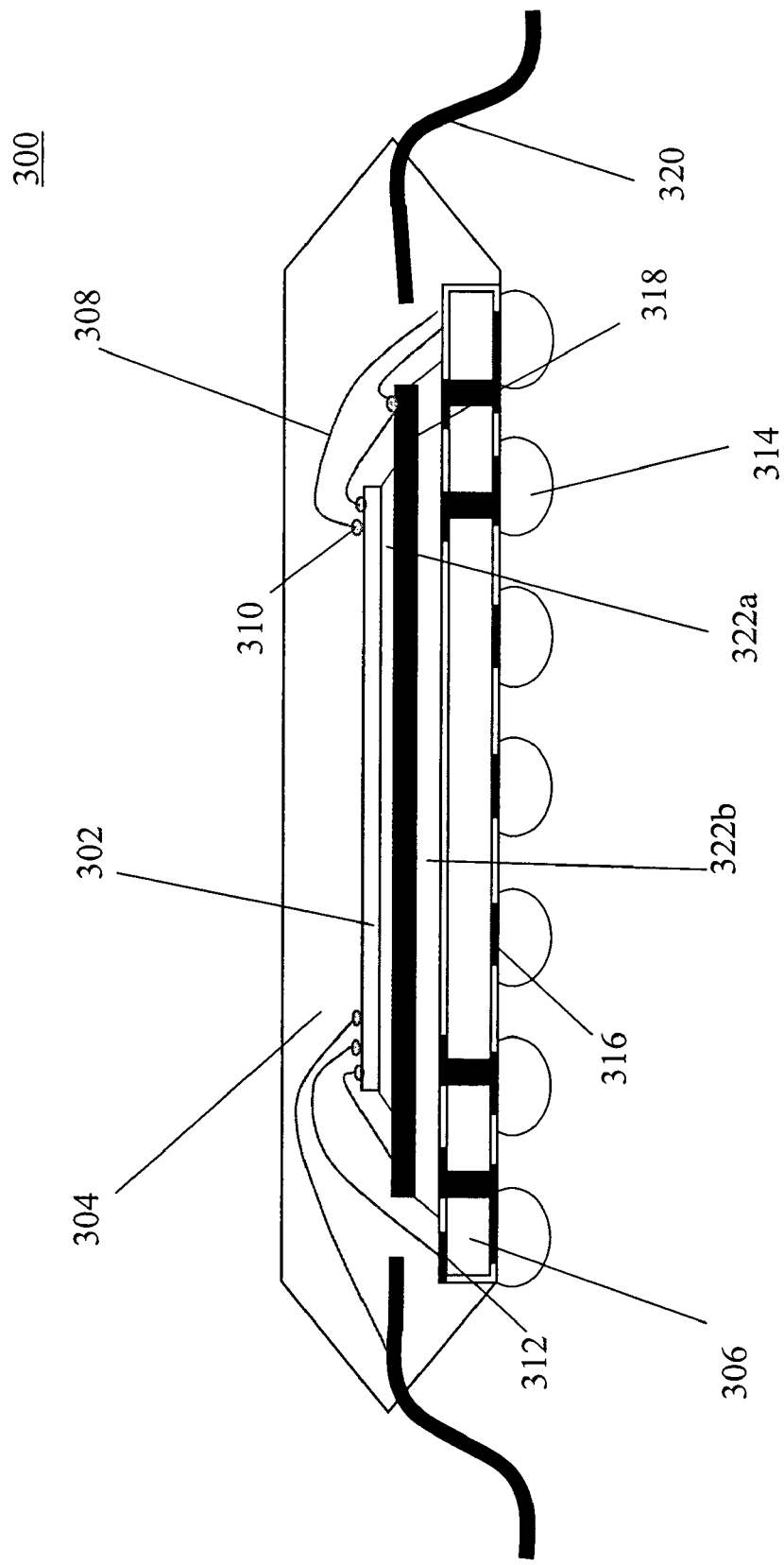
FIG. 3 shows a leadframe-ball grid array (LF-BGA) package, according to an embodiment of the present invention.
Figure 4:
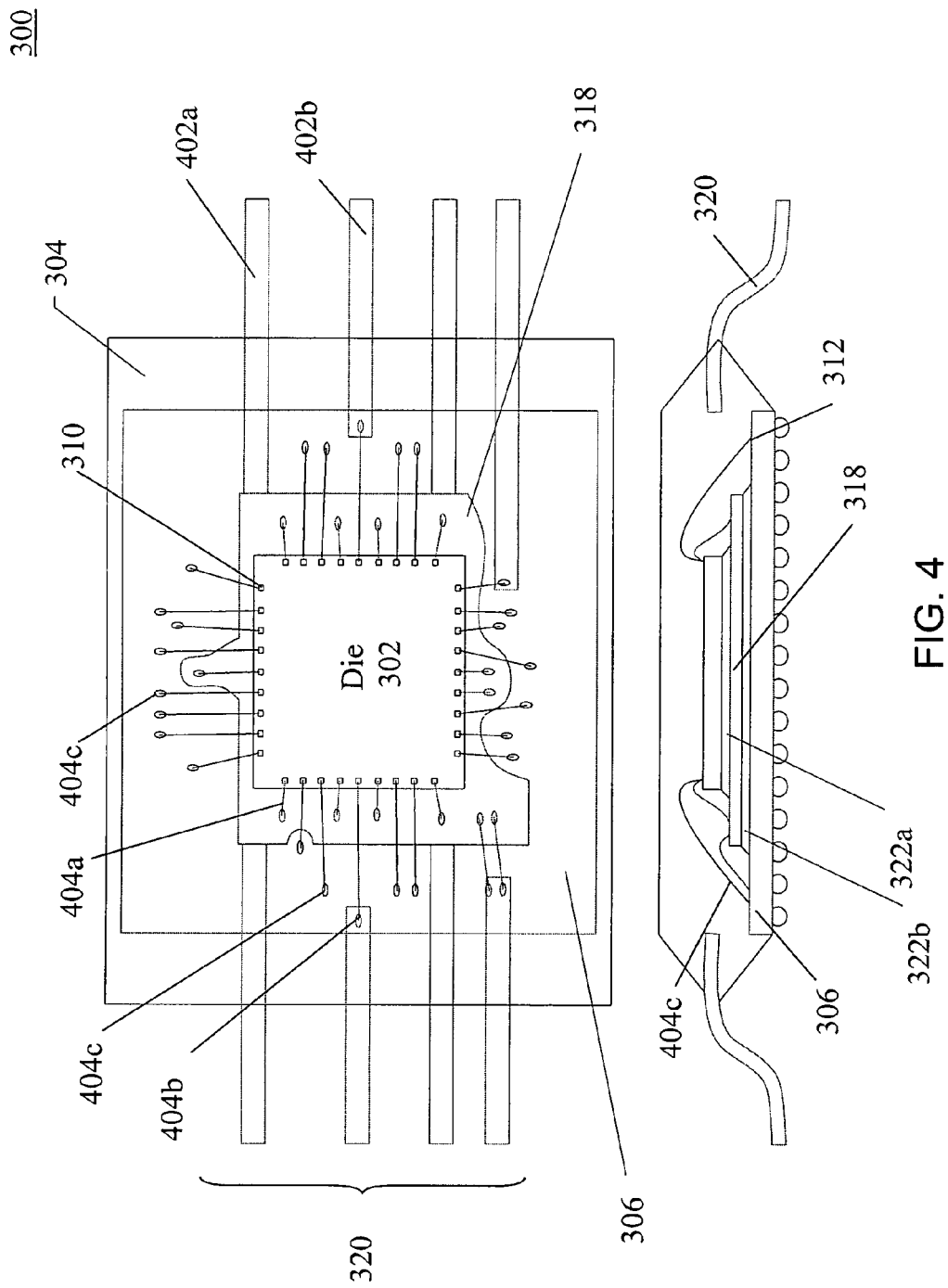
FIG. 4 shows a LF-BGA package, according to an embodiment of the present invention.

FIGS. 3 and 4 show top and side cross-sectional views of a package 300, according to an embodiment of the present invention. Package 300 includes IC die 302, mold compound 304, substrate 306, wirebonds 308, bond pads 310, bond fingers 312, solder balls 314, contact pads 316, die attach pad 318, and leads 320. As shown in FIG. 3, package 300 is a combination of a BGA package, such as BGA package 100 described with reference to FIG. 1, and a leadframe package, such as leadframe package 200 described with reference to FIG. 2. Thus, package 300 is referred to herein as a leadframe-ball grid array (LF-BGA) package. Similar to packages 100 and 200 described above, package 300 may be used to mount an IC die onto a PCB.

In package 300, IC die 302 is coupled to die attach pad 318 through an adhesive 322a. Die attach pad 318 is coupled to one or more leads of leads 320. Die attach pad 318 is also coupled to substrate 306 through an adhesive 322b. Adhesives 302a and 302b may be thermally and/or electrically conductive. Wirebonds 308 couple bond pads 310 on the first surface of IC die 302 to bond fingers 312 on substrate 306, die attach pad 318, and leads of leads 320. IC die 302, then, may be coupled to a PCB through solder balls 314 and/or leads 320. Thus the number of possible connections to a PCB for LF-BGA package 300 is increased over both BGA package 100 and leadframe package 200 since both the footprint of LF-BGA package 300 and the periphery of LF-BGA package 300 may be used to form connections with a PCB. As described above, increasing the number of possible connections with a PCB increases the total number of I/O connections a package can support. Therefore, LF-BGA package 300 allows for a greater number of I/O connections compared to both BGA package 100 and leadframe package 200.

In package 300, heat may be transferred from IC die 302 to the PCB in a variety of ways. IC die 302 is coupled to die attach pad 318 through adhesive 322a. As described above with reference to FIG. 2, die attach pad 318 is often made out of a thermally conductive material such as a metal (e.g., copper). In an embodiment in which adhesive 322a is a thermally conductive adhesive, heat may be transferred from the second surface of IC die 302 to die attach pad 318. Although not shown in FIG. 3, for ease of display, FIG. 4 shows that die attach pad 318 is coupled to leads of leads 320 such that heat transferred from IC die 302 to die attach pad 318 may be transferred to a PCB through leads of leads 320. In the embodiment in which adhesive 322b is thermally conductive, heat may also be transferred from the second surface of IC die 302 through die attach pad 318, substrate 306, and to a PCB through contact pads 316 and solder balls 314. Thus, the leadframe may function as a heat spreader that spreads heat from IC die 302.

Additionally or alternatively, heat may be transferred from the first surface of IC die 302 through wirebonds 308 that are coupled to leads 320 and die attach pad 318 and through wirebonds 308 that are coupled to bond fingers 312. Heat transferred to bond fingers 312 may be transferred to a PCB through contact pads 316 and solder balls 314. Thus, heat may be transferred from IC die 302 to the PCB through both leads 320 and solder balls 314. Therefore, package 300 exhibits increased thermal performance compared to both BGA package 100 and leadframe package 200.

Power and ground connections may also be enhanced using LF-BGA package 300. One or more leads of leads 320 may be used to provide reliable and stable power and ground connections. As described above, leads 320 typically result in connections that have improved performance when compared to connections formed through high density solder ball connections. In LF-BGA package 300, leads of leads 320 may be used to provide high quality power and ground. In such an embodiment, all of solder balls 314 and some leads of leads 320 remain available for other types of connections such as I/O connections. Thus LF-BGA package 300 allows for high quality supply voltage and ground connections that may be available from leadframe packages such as leadframe package 200 shown in FIG. 2 while retaining the high number of possible I/O connections that are typically available to BGA packages such as BGA package 100 shown in FIG. 1. Also, as would be appreciated by those skilled in the relevant art(s), leadframe packages are typically inexpensive compared to BGA packages. Thus package 300 benefits from the increased thermal performance and high quality supply voltage and ground signals that are characteristics of leadframe packages without being significantly more expensive than a BGA package similar to BGA package 100.

FIG. 4 shows that leads 320 may include two types of leads exemplified by a lead 402a and a lead 402b. As shown in FIG. 4, lead 402a is fused to die attach pad 318. Leads of leads 320 that are similarly fused to die attach pad 318 are collectively referred to as leads 402a for convenience. Leads 402a may be used to provide reliable ground and/or supply voltage connections to IC die 302. IC die 302 may be coupled to the high quality signals provided by leads 402a through wirebonds 404a. Wirebonds 404a coupled bond pads 310 on IC die 302 to leads 402a. Additionally or alternatively, in the embodiment that adhesive 322a is electrically conductive, IC die 302 is also electrically coupled to leads 402a through die attach pad 318.

FIG. 4 also shows lead 402b that is not fused to die attach pad 318. Leads similar to lead 402b are collectively referred to as leads 402b. Leads 402b are not electrically coupled to die attach pad 318 or leads 402a. Thus, leads 402b may be used to form connections with a PCB for other types of connections, such as I/O connections. As described above, since traces emanating from connections made to the PCB through leads of a leadframe are typically routed on the top surface of the PCB, those signals tend to have better quality than signals that are routed through two or more layers of the PCB. Thus, leads 402b may be used to provide high quality connections to the PCB. IC die 302 may be coupled to leads 402b through wirebonds 404b and bond pads 310.

Also as shown in FIG. 4, IC die 302 may also be coupled to a PCB through solder balls 314. Bond pads 310 of IC die 302 may be coupled to bond fingers 312 on substrate 306 through wirebonds 404c and to the PCB through solder balls 314.

Figure 5:
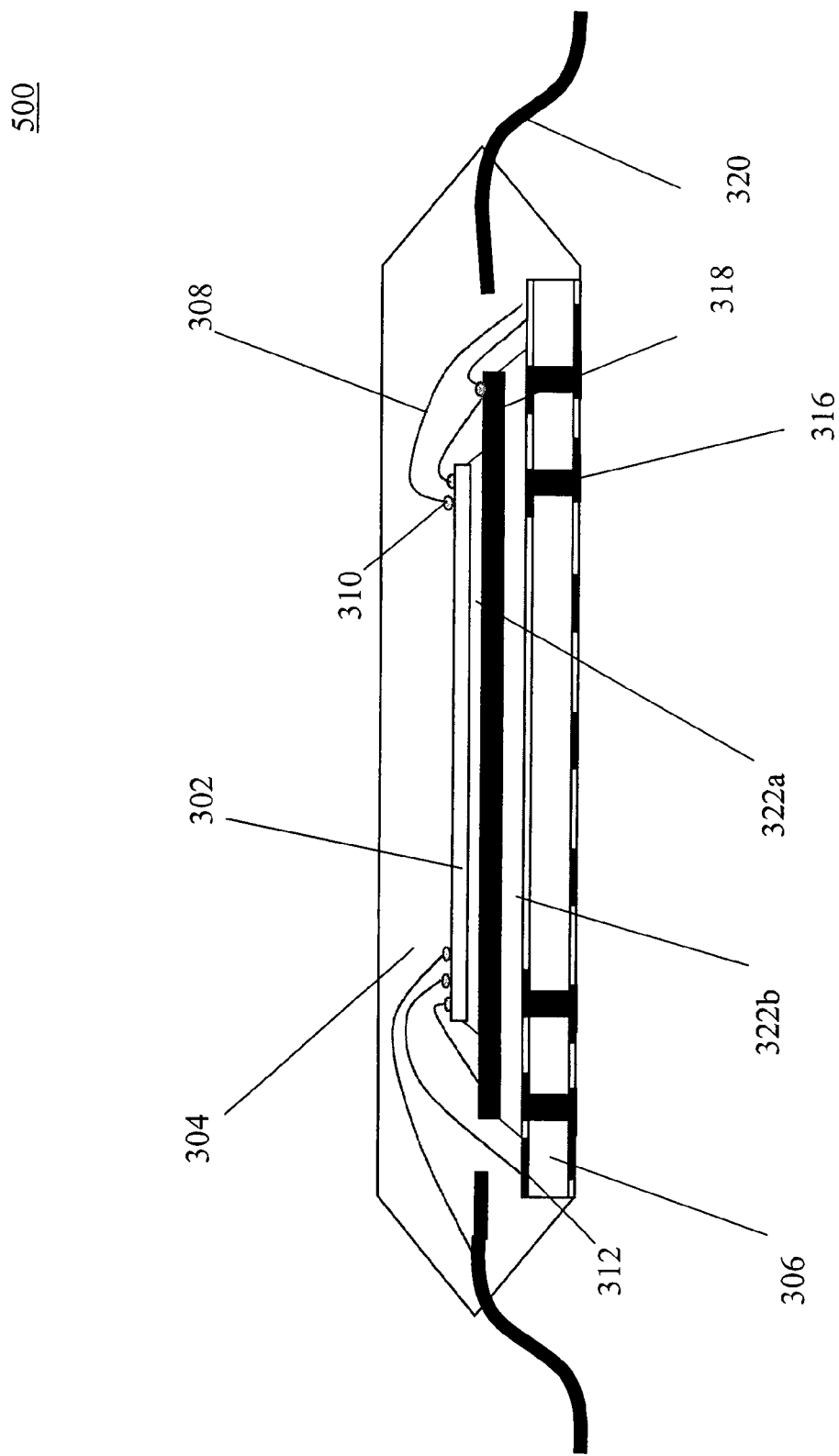
FIG. 5 shows a leadframe-land grid array (LF-LGA) package, according to an embodiment of the present invention.

FIG. 5 shows a package 500, according to an embodiment of the present invention. Package 500 is substantially similar to package 300 described with reference to FIG. 3 except that solder balls 314 are removed. In the embodiment of FIG. 5, contact pads 316 are land grid array (LGA) contacts. In connecting to a PCB, solder may be placed on LGA contacts 118 to couple package 500 to the PCB. Thus, package 500 may be termed a leadframe-land grid array (LF-LGA) package that operates substantially similar to a LF-BGA package as described above.

Figure 6:
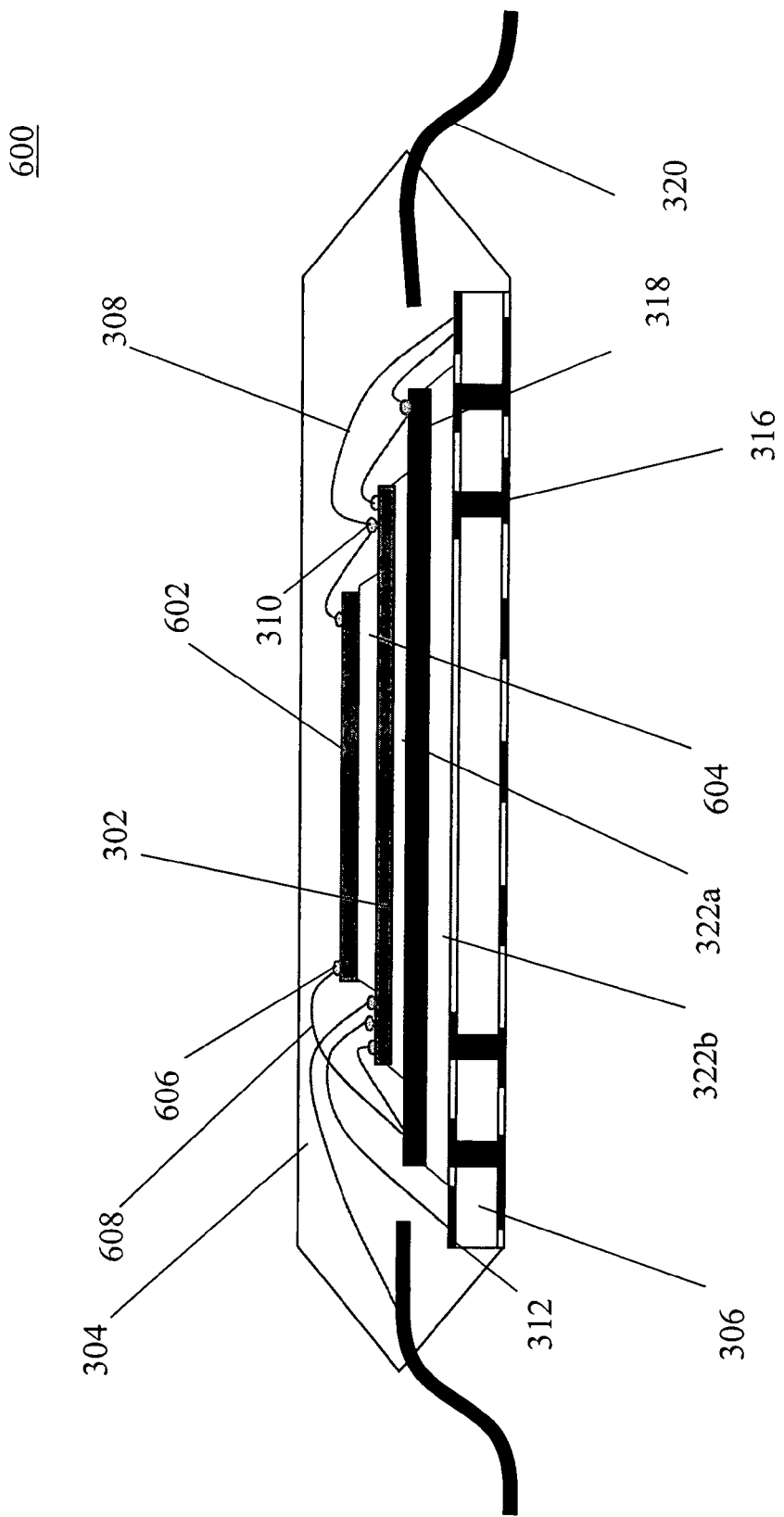
FIGS. 6-8 show stacked die LF-LGA packages, according to embodiments of the present invention.

FIG. 6 shows a LF-LGA package 600, according to an embodiment of the present invention. LF-LGA package 600 is generally similar to LF-LGA package 500 described with reference to FIG. 5. However, LF-LGA package 600 additionally includes a second IC die 602. Second IC die 602 is coupled to the first surface of IC die 302 through an adhesive 604. Adhesive 604 may be thermally and/or electrically conductive. As shown in FIG. 6, bond pads 606 on a first surface of second IC die 602 may be coupled to leads of leads 320, die attach pad 318, and substrate 306 through wirebonds 608.

As shown in FIG. 6, LF-LGA package 600 allows for two IC die to be included in the same package. In an embodiment IC die 302 is a memory device and second IC die 602 is an application specific integrated circuit (ASIC). In such an embodiment, package 600 may be configured such that the memory device may interact with the ASIC. Alternatively, package 600 may be configured such that the memory device and the ASIC are isolated. In alternate embodiments, IC die 302 and second IC die 602 may be other combinations of memory devices, ASICs, or other elements as would be apparent to those skilled in the relevant art(s).

Figure 7:
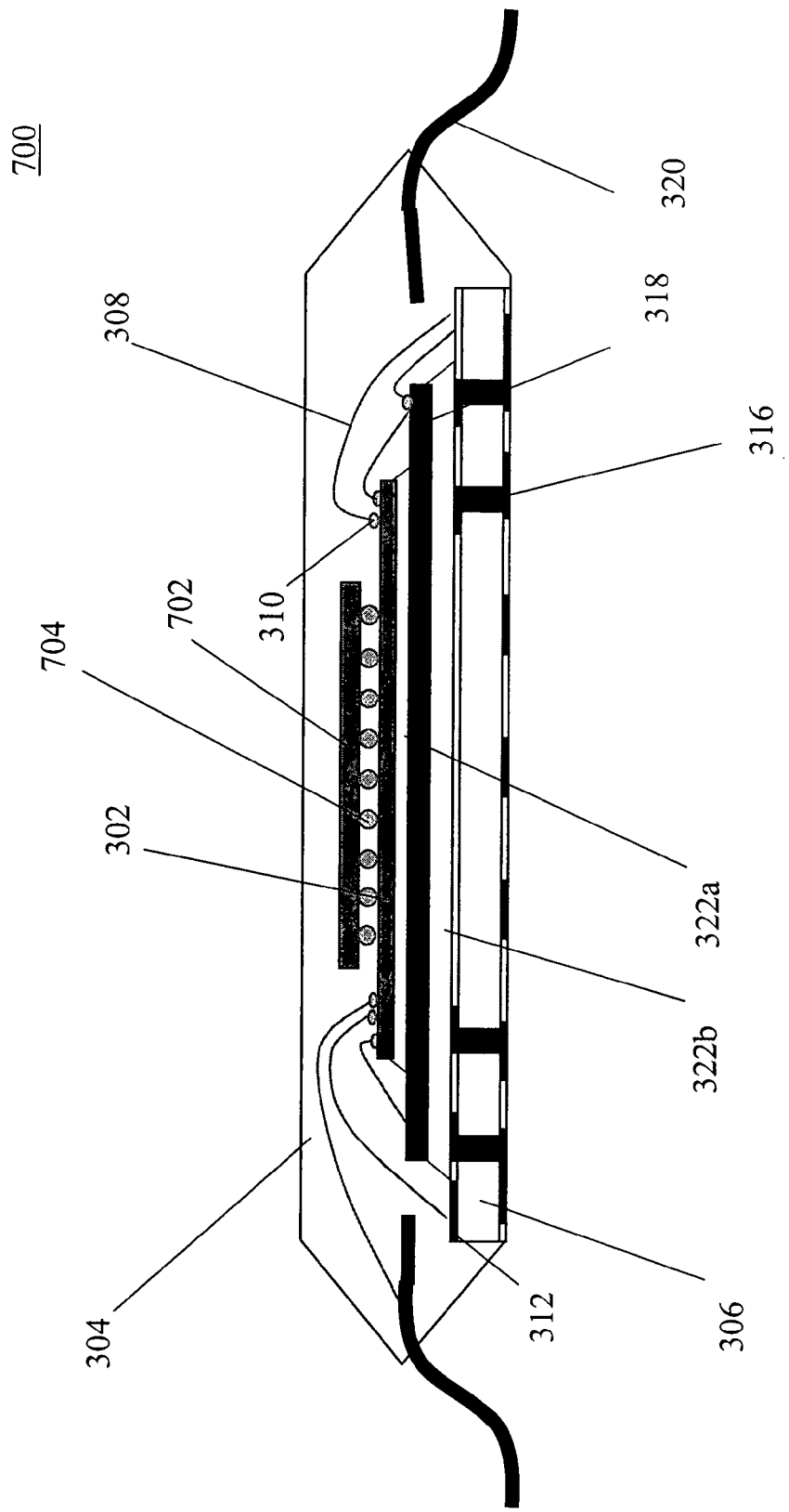

FIG. 7 shows a stacked die LF-LGA package 700, according to an embodiment of the present invention. Package 700 is generally similar to package 600 shown in FIG. 6. However, instead of including a die up configured second IC die 602 stacked on first IC die 302, package 700 includes a die down configured second IC die 702 stacked on first IC die 302. In such a configuration, bond pads 704 of second IC die 702 are coupled to the first surface of IC die 302. From the first surface of IC die 302, second IC die 702 may then be coupled to leads 320, die attach pad 318, and/or, LGA contacts 118 through traces formed on the first surface of IC die 302 and wirebonds 308 and/or through IC die 302. Additionally or alternatively, second IC die 702 may interact with first IC die 302 through bond pads 704. For example, second IC die 702 may be a memory associated with IC die 302. In such an embodiment, the contents of second IC die 702 (i.e., the memory) may be directly accessed by IC die 302 through bond pads 704. Alternatively, second IC die 702 may be a power management unit (PMU) configured to manage power used by IC die 302.

In alternate embodiments, IC die 302 and second IC die 702 may be any combination of memory devices, ASICs, PMUs, or other intergrated circuit devices, as would be appreciated by those skilled in the relevant art(s).

Figure 8:
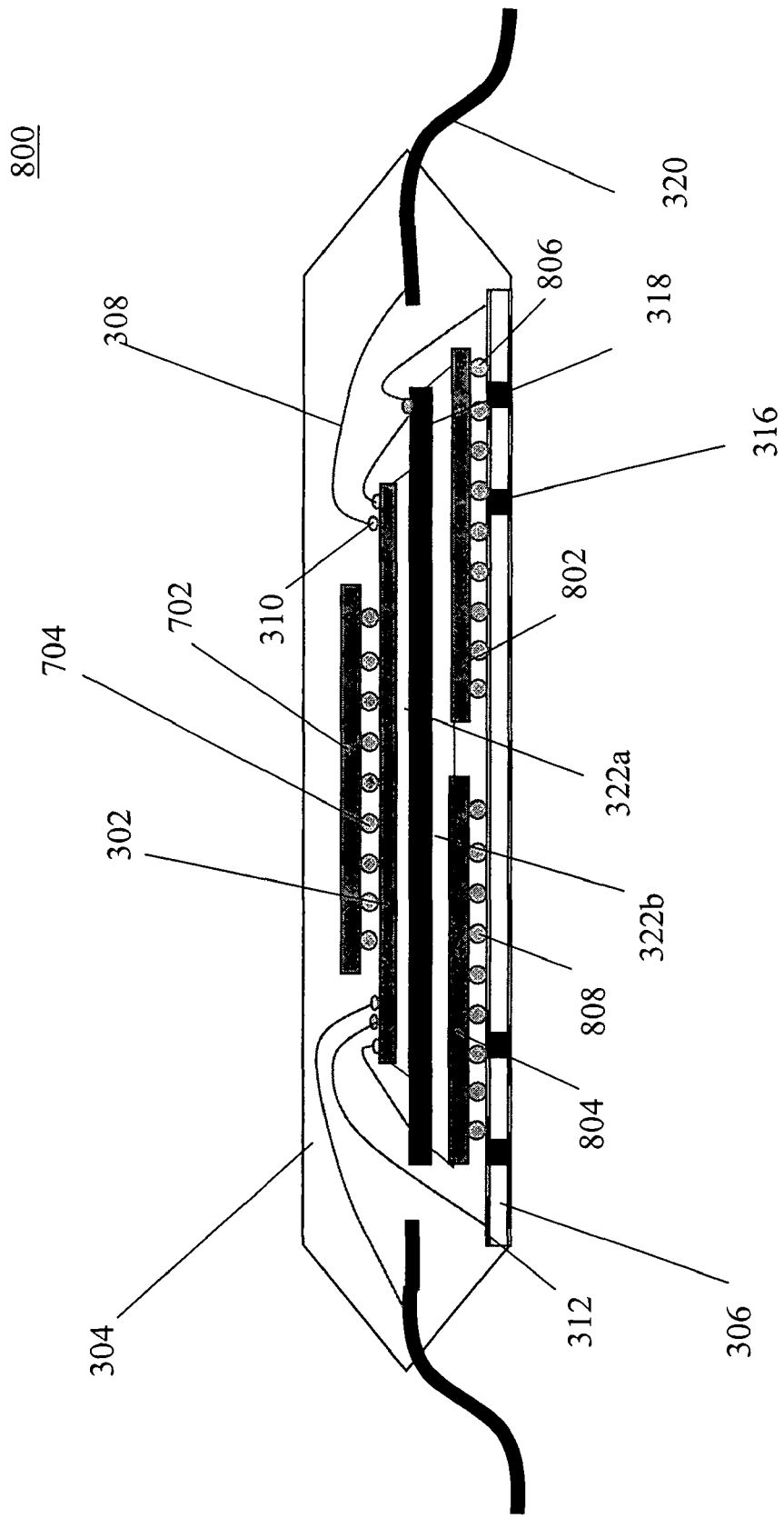

FIG. 8 shows a stacked die LF-LGA package 800, according to an embodiment of present invention. Stacked die LF-LGA package 800 is generally similar to stacked die LF-LGA package 700 shown in FIG. 7. However, package 800 additionally includes a third IC die 802 and a fourth IC die 804. As shown in FIG. 8, both third IC die 802 and fourth IC die 804 are implemented in die down configurations. Third IC die 802 and fourth IC die 804 are coupled to substrate 306 through bond pads 806 and bond pads 808 formed on first surfaces of third IC die 802 and fourth IC die 804, respectively. Through substrate 306, then, third IC die 802 and fourth IC die 804 are electrically coupled to a PCB to which package 800 is attached. In alternate embodiments, third IC die 802 and fourth IC die 804 may be implemented in a die-up configuration. In such an embodiments, wirebonds may couple bond pads on third IC die 802 and fourth IC die 804 to substrate 306, die attach pad 318, leads of leads 320, IC die 302, and/or second IC die 702.

Heat may be transferred from the first surfaces third IC die 802 and fourth IC die 804 through substrate 306. Additionally, die attach pad 318 is coupled to second surfaces of third IC die 802 and fourth IC die 804 through adhesive 322b. Thus, heat may also be conducted away from third IC die 802 and fourth IC die 804 through lead of leads 320 that are coupled to die attach pad 204.

In embodiments, IC die 302, second IC die 702, third IC die 802, and fourth IC die 804 may be any combination of ASICs, memory devices, system in package (SIP) ICs, and/or PMUs as would be appreciated by those skilled in the relevant art(s).

Packages 600, 700, and 800 are shown to be a stacked die LF-LGA packages. As would appreciated by those skilled in the relevant art(s), similar stacked die packages may also be implemented as LF-BGA packages in which contact pads 316 are solder ball pads and solder balls are formed thereon, without departing from the scope and spirit of the invention.

Figure 9:
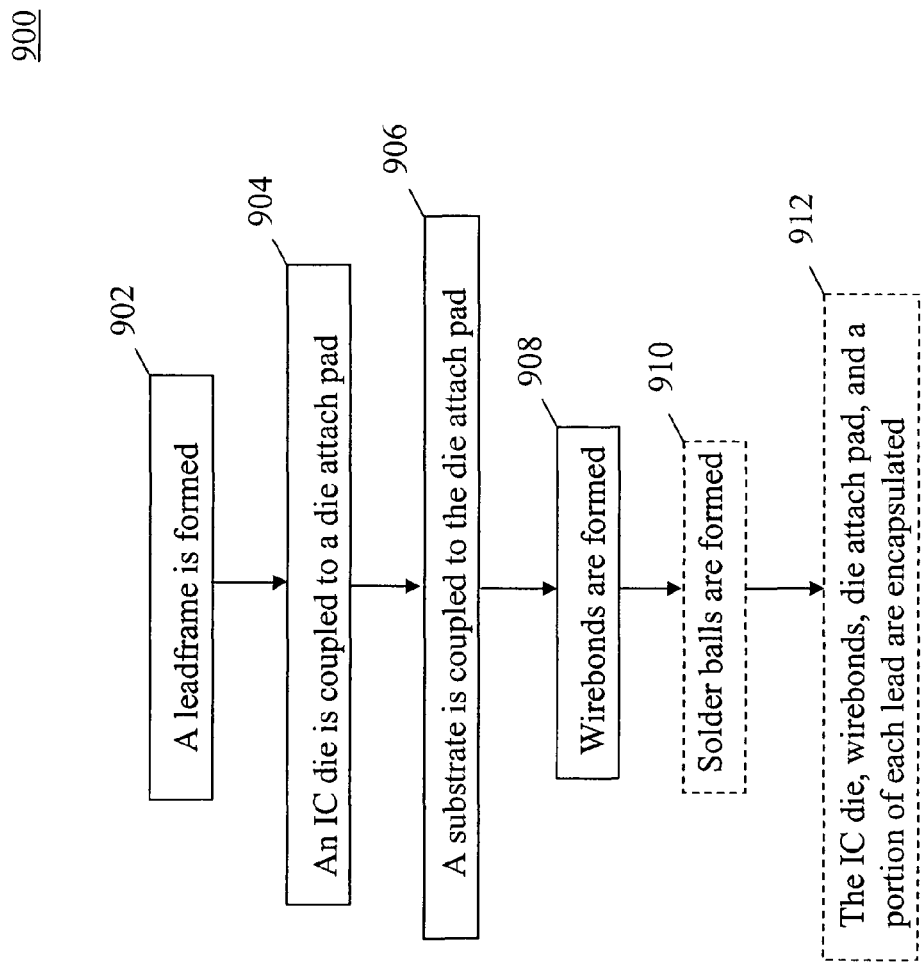
FIG. 9 shows a flowchart providing example steps for assembling an integrated circuit package, according to an embodiment of the present invention.

FIG. 9 shows a flowchart 900 providing example steps for assembling an IC package. Other structural and operational embodiments will be apparent to persons skilled in the relevant art(s) based on the following discussion. The steps shown in FIG. 9 do not necessarily have to occur in the order shown. The steps of FIG. 9 are described in detail below.

Flowchart 900 begins in step 902. In step 902, a leadframe is formed. For example, in FIG. 3, a leadframe is formed so as to include die attach pad 318 and leads 320. Leads 320 emanate in an outward direction from die attach pad 318. As shown in FIG. 4, leads 320 may include leads 402a that are coupled to die attach pad 318 and leads 402b that are not coupled to die attach pad 318.

In step 904, an IC die is coupled to a die attach pad. For example, in FIG. 3, IC die 302 is coupled to die attach pad 318 through adhesive 322a. Adhesive 322a may be thermally and/or electrically conductive.

In step 906, a substrate is coupled to the die attach pad. For example, in FIG. 3, substrate 306 is coupled to die attach pad 318 through adhesive 322b. Adhesive 322b may be thermally and/or electrically conductive.

In step 908, wirebonds are formed. Wirebonds may couple bond pads on a first surface of the IC die to one or more leads, the die attach pad, and/or bond fingers on the substrate. For example, in FIG. 3, wirebonds 308 coupled bond pads 310 to one or more leads of leads 320, die attach pad 318, and bond fingers 312 on substrate 306.

In optional step 910, solder balls are formed. Solder balls may be formed on solder ball pads on the substrate. The solder balls may facilitate mounting of the IC package on to a printed circuit board (PCB). For example, in FIG. 3, solder balls 314 are formed on contact pads 316. In alternate embodiments, contact pads 316 may be land grid array (LGA) contacts that facilitate mounting the package on to a PCB.

In optional step 912, the IC die, wirebonds, die attach pad, and a portion of each lead are encapsulated in a mold material. For example, in FIG. 3, IC die 302, wirebonds 308, die attach pad 318, and a portion of each lead of leads 320 are encapsulated in mold compound 304.

Figure 10:
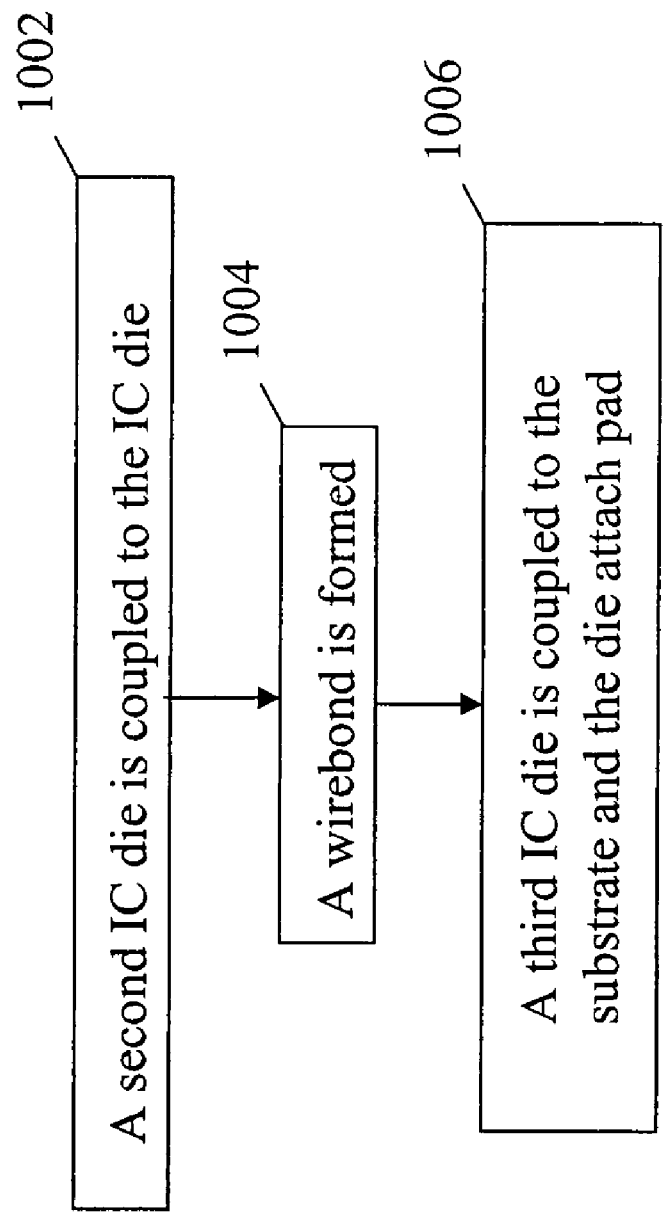
FIG. 10 shows example steps that may be performed in the flowchart of FIG. 9, according to an embodiment of the present invention.

FIG. 10 provides optional steps for flowchart 900. FIG. 10 shows steps 1002, 1004, and 1006. In step 1002, a second IC die is coupled to the IC die. For example, in FIG. 6, second IC die 602 is coupled to IC die 302 through adhesive 604 in a die-up configuration. In alternate embodiments, as shown in FIG. 7, second IC die 702 may be configured in a die-down configuration.

In step 1004, a wirebond is formed. The wirebonds may couple bond pads on the second IC die to the IC die, the die attach pad, one or more leads, and/or the substrate. For example, in FIG. 6, wirebonds 608 couple bond pads 606 to IC die 302, die attach pad 318, one or more leads of leads 320, and/or substrate 306. In alternate embodiments, the second IC die may be configured in a die-down configuration in which contact pads on the second IC die are coupled to the IC die.

In step 1006, a third IC die is coupled to the substrate and the die attach pad. For example, in FIG. 8, third IC die 802 is coupled to substrate 306 through contacts 806 and to die attach pad 318 through adhesive 322b.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An integrated circuit (IC) device package, comprising:
   a leadframe, including:
      a die attach pad having opposing first and second surfaces; and
      a plurality of leads, wherein each lead of the plurality leads emanates in an outward direction from the die attach pad;
   an IC die that is coupled to the first surface of the die attach pad;
   a substrate coupled to the die attach pad, having opposing first and second surfaces, wherein contact pads on the first surface of the substrate are electrically connected to bond fingers on the second surface of the substrate;
   a first wirebond that electrically couples a first bond pad on a first surface of the IC die to a bond finger on the second surface of the substrate; and
   a second wirebond that electrically couples a second bond pad on the first surface of the IC die to a lead of the plurality of leads.

2. The package of claim 1, further comprising:
a third wirebond that couples a third bond pad on the first surface of the IC die to the die attach pad.

3. The package of claim 1, wherein the plurality of leads comprises:
a first lead that is coupled to the die attach pad; and
a second lead that is isolated from the die attach pad.

4. The package of claim 3, wherein the second wirebond electrically couples the second bond pad to the second lead.

5. The package of claim 3, wherein the first lead is electrically coupled to an electric potential.

6. The package of claim 5, wherein the electric potential is ground or a supply voltage.

7. The package of claim 5, wherein the electric potential is a supply voltage.

8. The package of claim 1, wherein the leadframe functions as a heat spreader the spreads heat away from the IC die.

9. The package of claim 1, wherein the contact pads are solder ball pads, further comprising:
solder balls formed on the solder ball pads.

10. The package of claim 1, wherein the contact pads are land grid array contacts.

11. The package of claim 1, further comprising a thermally conductive adhesive that couples the IC die to die attach pad.

12. The package of claim 11, wherein the thermally conductive adhesive is electrically conductive.

13. The package of claim 1, further comprising a thermally conductive adhesive that couples the substrate to die attach pad.

14. The package of claim 1, wherein the IC die is one of a memory component, an application specific integrated circuit, a power management unit, and a system in package integrated circuit.

15. The package of claim 1, further comprising:
a second IC die coupled to the first surface of the IC die.

16. The package of claim 15, further comprising:
a fourth wirebond that electrically couples a bond pad on a first surface of the second IC die to a conductive region selected from the group consisting of the first surface of the IC die, the die attach pad, a lead of the plurality of leads, and a bond finger on the second surface of the substrate.

17. The package of claim 15, wherein the second IC die is configured in a die-down configuration, wherein contact pads on a first surface of the second IC die are coupled to the first surface of the IC die.

18. The package of claim 15, wherein the second IC die is one of a memory component, an application specific integrated circuit, a power management unit, and a system in package integrated circuit.

19. The package of claim 15, further comprising:
a third IC die that is coupled to the second surface of the substrate and the die attach pad.

20. The package of claim 19, wherein the third IC die is configured in a die-down configuration, wherein contact pads on a first surface of the third IC die are coupled to bond fingers on the second surface of the substrate.

21. The package of claim 19, wherein the third IC die is one of a memory component, an application specific integrated circuit, a power management unit, and a system in package integrated circuit.

22. The package of claim 1, further comprising:
a mold compound that substantially encapsulates the IC die, the die attach pad, the first wirebond, the second wirebond, and at least a portion of each lead of the plurality of leads.

* * * * *